United States Patent [19]
See et al.

[11] Patent Number: 5,674,762
[45] Date of Patent: Oct. 7, 1997

[54] METHOD OF FABRICATING AN EPROM WITH HIGH VOLTAGE TRANSISTORS

[75] Inventors: Yee-Chaung See; Lewis E. Terry, both of Phoenix, Ariz.; Craig A. Cavins, Pflugerville, Tex.

[73] Assignee: Motorola, Inc., Schaumburg, Ill.

[21] Appl. No.: 520,147

[22] Filed: Aug. 28, 1995

[51] Int. Cl.$^6$ .................. H01L 21/8247; H01L 21/265
[52] U.S. Cl. ........................... 437/31; 437/43; 437/52
[58] Field of Search ........................ 437/31, 43, 45, 437/52; 148/DIG. 126

[56] References Cited

U.S. PATENT DOCUMENTS

| | | |
|---|---|---|
| 4,907,058 | 3/1990 | Sakai . |
| 4,918,333 | 4/1990 | Anderson et al. ............... 307/270 |
| 5,089,433 | 2/1992 | Anand et al. ................... 437/40 |
| 5,130,769 | 7/1992 | Kuo et al. . |
| 5,204,541 | 4/1993 | Smayling et al. ............... 257/138 |
| 5,225,700 | 7/1993 | Smayling ........................ 257/321 |
| 5,341,342 | 8/1994 | Brahmbhatt .................... 365/182 |
| 5,348,895 | 9/1994 | Smayling et al. . |
| 5,382,536 | 1/1995 | Malhi et al. . |
| 5,409,854 | 4/1995 | Bergemont ...................... 437/43 |
| 5,514,889 | 5/1996 | Cho et al. ....................... 257/316 |

OTHER PUBLICATIONS

IEEE 1991, Custom Integrated Circuits Conferences, Chang et al. "A Modular Flash EEPROM Technology for 0.8μm High Speed Logic Circuits", Feb. 1991, pp. 18.7.1–18.7.4.
IEDM 1992, Tsui et al., "Integration of Power LDMOS into a Low–Voltage 0.5μm BiCMOS Technology", 1992, pp. 2.3.1–2.3.4, month unknown.
IEEE Transactions on Electron Devices, Tsui et al., "A Versatile Half–Micron Complementary BiCMOS Technology for Microprocessor–Based Smart Power Applications", Mar., 1995, vol. 42, No. 3, pp. 564–570.

*Primary Examiner*—John Niebling
*Assistant Examiner*—Richard A. Booth
*Attorney, Agent, or Firm*—George C. Chen

[57] ABSTRACT

A method of fabricating an integrated circuit (272) having memory, logic, high voltage, and high current functionality uses a modular implant process step (104) to form a drain extension region (204), a source extension region (205), and a base extension region (206) in a substrate (200). The dopants from the modular implant process step (104) are later diffused into the substrate (200) during a LOCOS process step (105). A modular gate oxide formation step (111) produces three different thicknesses of gate oxides (309, 311, 312) which provide ultra high voltage, high voltage, and low voltage functionality for the integrated circuit (272).

14 Claims, 8 Drawing Sheets

METHOD OF FABRICATING AN EPROM WITH HIGH VOLTAGE TRANSISTORS

BACKGROUND OF THE INVENTION

This invention relates, in general, to a method of fabricating semiconductor devices, and more particularly, to fabricating an integrated circuit having logic, memory, high voltage, analog, and high current capabilities.

Many semiconductor products for automotive and other industrial applications require the integration of higher voltage protection and higher current driving capabilities to existing microcontroller unit (MCU) technologies. Typically, high voltage and high current devices are located on a separate chip from the MCU chip. However, with the continuing efforts of device integration to produce smaller and more compact systems, process steps for fabricating ultra high voltage transistors, high current transistors, and analog circuits need to be incorporated into existing MCU process flows.

Accordingly, a need exists for a method of fabricating an integrated circuit having an MCU, high voltage devices, and high current devices. Implementation of these additional semiconductor devices into existing MCU process flows should not adversely affect the MCU devices which include, but are not limited to, non-volatile memory cells and logic or digital devices. Moreover, the additional process steps required to fabricate the extra high voltage and high current devices should introduce minimal complexity for cost effectiveness, should be scaleable to provide the capability of producing smaller devices, and should be modular. The modular feature enables a single process flow to fabricate different combinations of semiconductor devices for various applications with minimal complications. In other words, if a particular device was not needed for one application, the process steps which were only used for that particular device should be able to be eliminated from the process flow without requiring the remaining process steps to be modified.

DETAILED DESCRIPTION OF THE DRAWINGS

Figure 1:
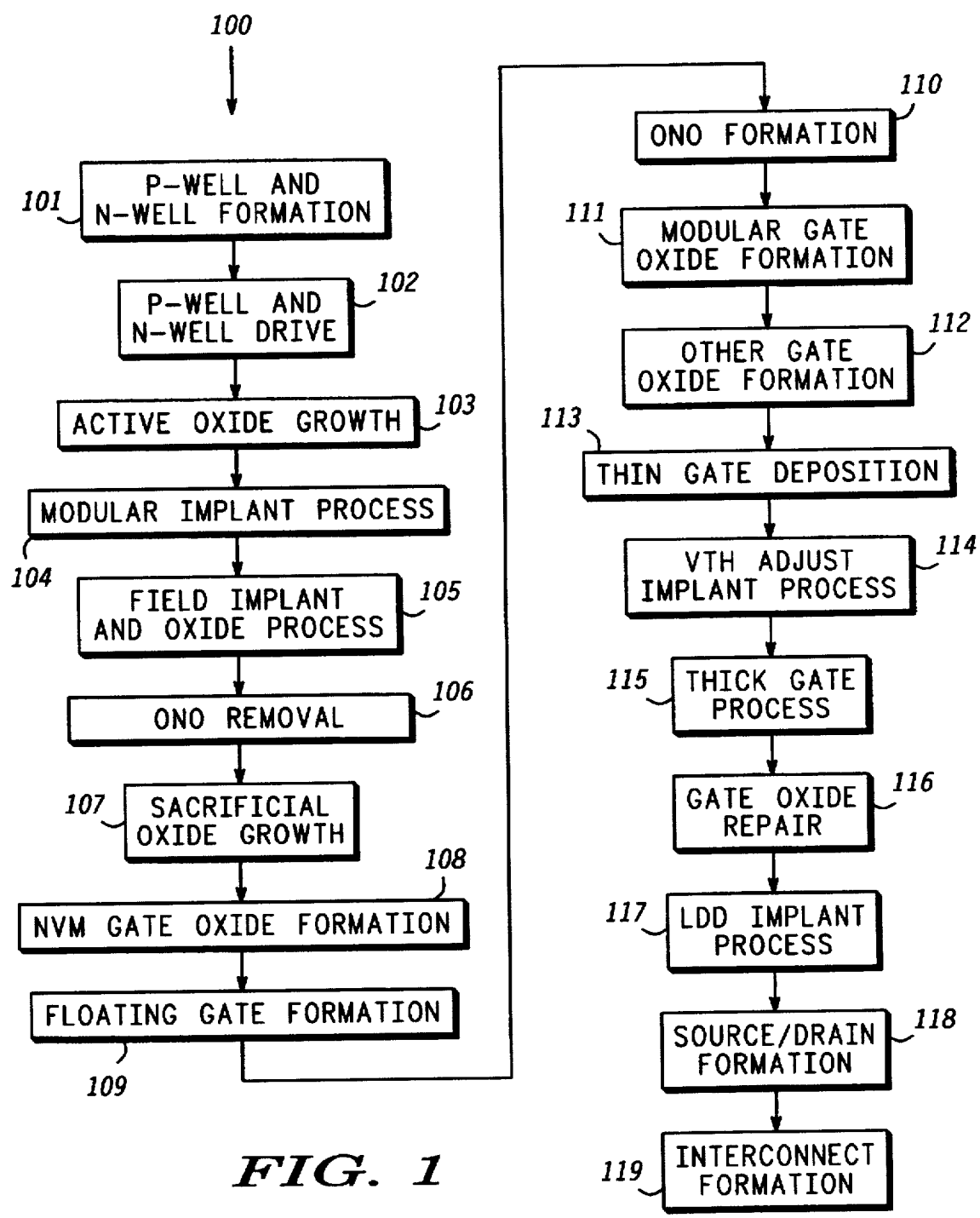
FIG. 1 outlines a process flow for a method of fabricating an integrated circuit having logic, memory, high voltage, and high current functionality in accordance with the present invention.

Turning to the drawings for a more detailed description of the present invention, FIG. 1 outlines a process flow 100 for a method of fabricating an integrated circuit having logic, memory, high voltage, and high current capabilities in accordance with the present invention. The integrated circuit has MCU transistors, ultra high voltage transistors, high voltage transistors, high current transistors. FIG. 1 begins with process step 101 which involves N-well and P-well formation in a substrate. As depicted in the partial cross-sectional view of FIG. 2, a substrate 200 is a semiconductor substrate which is preferably a P-type silicon substrate having a resistivity preferably between about 5 ohm-cm and 50 ohm-cm. P-well or region 202 in substrate 200 has a first conductivity type, preferably P-type, and N-wells or regions 201 and 203 have a second conductivity type, preferably N-type.

N-wells 201 and 203 and P-well 202 are formed by the following process. A silicon dioxide layer is thermally grown on a surface of substrate 200, preferably to a thickness of approximately 200 angstroms (Å) to 600 Å. A silicon nitride layer, preferably 1,000 Å to 2,000 Å thick, is disposed over the oxide layer using a chemical vapor deposition (CVD) technique. The silicon dioxide layer serves as a transition region to cushion the stresses between substrate 200 and the overlaying silicon nitride layer. A photoresist pattern exposes portions of the silicon nitride layer, and a reactive ion etch (RIE) is used to remove the exposed portions of the silicon nitride layer thereby exposing the underlying silicon dioxide layer and defining the width of N-wells 201 and 203. Ions are implanted into N-wells 201 and 203 using the photoresist pattern and the remaining silicon nitride layer as an implant mask. The ions are implanted through the silicon dioxide layer which serves as an implant screen to reduce ion channeling and contamination of N-wells 201 and 203. After implantation, the photoresist pattern is removed. The ions implanted into regions 201 and 203 are N-type silicon dopants such as phosphorous or the like and can be implanted at a dose preferably ranging from about $1 \times 10^{12}$ atoms/cm$^{-2}$ to $1 \times 10^{13}$ atoms/cm$^{-2}$ and at an energy preferably ranging from approximately 80 KeV to 120 KeV.

If desired, ion implantation steps with different doses can be used in conjunction with different photoresist patterns to define different types of N-wells: a lower ion implantation dose for N-wells of ultra high voltage transistors and a higher ion implantation dose for N-wells of MCU transistors. Whether embodied as a field effect transistor (FET) or a bipolar transistor, an ultra high voltage transistor has a breakdown voltage (BV) greater than roughly 25 volts but preferably greater than about 35 volts. For FETs, the specific BV being referred to is generally measured from the drain to the source or vice versa. For bipolar transistors, the specific BV being referred to is typically measured from the collector to the emitter or vice versa. In addition to memory cells, the MCU transistors include high voltage transistors which have a BV ranging between roughly 10 volts and 25 volts but preferably between about 15 volts and 25 volts. The MCU transistors also include low voltage or logic transistors which have a BV less than approximately 15 volts and have an operating voltage of about 5 volts.

After implanting N-wells 201 and 203, P-well 202 is doped using an ion implantation process having an implant dose of P-type ions such as boron preferably ranging from about $1 \times 10^{12}$ atoms/cm$^{-2}$ to $1 \times 10^{13}$ atoms/cm$^{-2}$ and having an implant energy preferably ranging from roughly 30 KeV to 60 KeV. P-well 202 can be self-aligned by first thermally growing several thousand angstroms of silicon dioxide over N-wells 201 and 203, removing the silicon nitride layer, and implanting a self-aligned implant of P-type ions through the silicon dioxide implant screen and into substrate 200. Similar to N-wells 201 and 203, P-wells of different doping levels can be formed, if desired, by using different ion implantation steps and different photoresist masks. For example, a higher dose can be used for P-wells of MCU transistors, and a lower dose can be used for P-wells of higher voltage transistors.

It is understood that many alternative embodiments of step 101 exist. For instance, the initial silicon dioxide layer can be deposited using a CVD technique instead of using the thermal growth technique. Furthermore, the order of N-well and P-well implantation may be reversed from the order described above, or arsenic can be used in place of phosphorous for the N-type dopant. Alternatively, the silicon nitride layer can be left out of the above process description such that the photoresist is patterned on the silicon dioxide layer instead of the silicon nitride layer.

Figure 2:
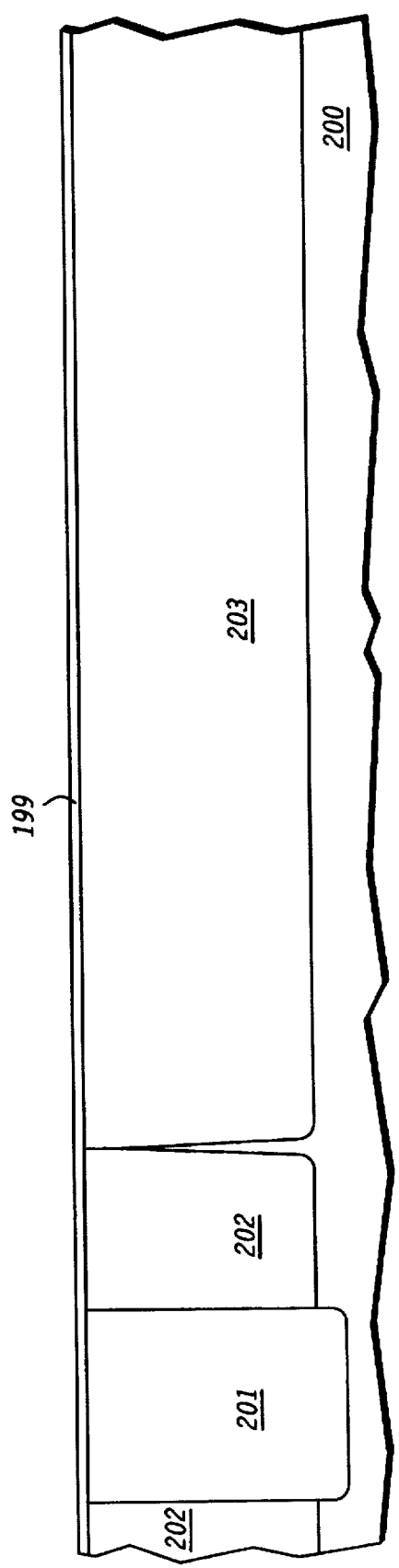
FIGS. 2–12 illustrate enlarged, partial cross-sectional views of process steps for fabricating the integrated circuit.

After doping P-well 202 of FIG. 2, step 102 of FIG. 1 is performed. The implanted ions within N-wells 201 and 203 and P-well 202 are driven or diffused into substrate 200 to form N-wells 201 and 203 and P-well 202 and to activate the implanted ions. The thermal process used for step 102 of FIG. 1 preferably occurs at a temperature of about 1,000 degrees Celsius (° C.) to 1,500° C. for approximately 2 hours to 4 hours.

After the N-well and P-well drive of step 102 of FIG. 1, the dielectric layers overlaying substrate 200 and defining N-wells 201 and 203 and P-well 202 are removed, and an active oxide layer 199 is disposed over substrate 200 of FIG. 2 as indicated in step 103 of FIG. 1. Active oxide layer or pad oxide 199 is preferably thermally grown silicon dioxide having a preferred thickness of approximately 200 Å to 600 Å. Active oxide layer 199 serves as a transition region to cushion the stresses between substrate 200 and a subsequently deposited silicon nitride layer and also serves as an implant screen for a subsequent modular implant process of step 104 as described below.

Figure 3:
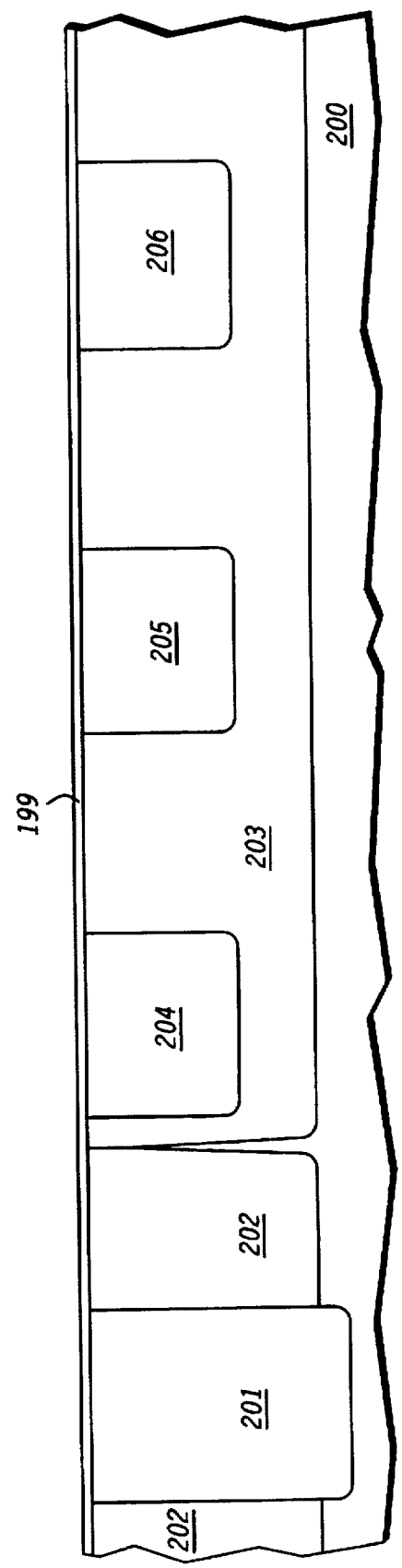

Continuing with FIG. 3, regions 204, 205, and 206 of FIG. 2 are implanted during the modular implant process of step 104. A photoresist mask is patterned over active oxide layer 199 to define the widths of regions 204, 205, and 206 during ion implantation and is removed after ion implantation. A preferred dose of about $7\times10^{12}$ atoms/cm$^{-2}$ to $3\times10^{13}$ atoms/cm$^{-2}$ of a P-type dopant such as boron or the like is implanted into regions 204, 205, and 206 at a preferred energy ranging from around 80 KeV to 150 KeV. A separate photoresist mask and ion implantation step can be used if different doping levels are desired for regions 204, 205, and 206. For instance, regions 204 and 205 could be an extension for a drain or source region to increase the BV of an ultra high voltage FET, and region 206 could be an extension of a base region to increase the BV for a bipolar transistor. If the ultra high voltage requirements of the FET and the beta requirements of the bipolar transistor cannot be simultaneously met with a single implant, then different photolithography masks would be required to provide different doping levels for regions 204, 205 and 206.

Step 104 of FIG. 1 is modular because step 104 can be eliminated from process flow 100 without affecting the remaining steps of process flow 100. If ultra high voltage transistors were not required, step 104 can be removed from process flow 100, and the other remaining steps of process flow 100 do not need to be adjusted or modified to accommodate the removal of step 104.

Step or modular step 104 is performed after the N-well and P-well drive of step 102 because regions 204, 205, and 206 are required to be more shallow compared to N-well 203 of FIG. 3. If regions 204, 205, and 206 were implanted prior to step 102 and the dopants of regions 204, 205, and 206 were diffused or driven into substrate 200 along with the dopants of N-well 203 during step 102, then regions 204, 205, and 206 would be nearly the same depth as N-well 203 which is not the desired result. The dopants of regions 204, 205, and 206 are activated and diffused into substrate 200 such that regions 204, 205, and 206 are preferably approximately 1.1 microns to 1.9 microns deep and are more shallow than N-well 203 as depicted in FIG. 3. The thermal process for diffusing wells which are less deep is described in the second portion of step 105.

Step 104 does not introduce unnecessary complexity into process flow 100 because step 104 uses previously formed active oxide layer 199 of step 103 as an implant mask and uses a subsequent thermal step as a well drive and activation step. Step 104 is modular because it does not contain a thermal process which will affect other existing doping profiles of substrate 200. The introduction of step 104 into process flow 100 does not require other process steps of process flow 100 to be modified since heat cycles or diffusion steps are not part of step 104.

Figure 4:
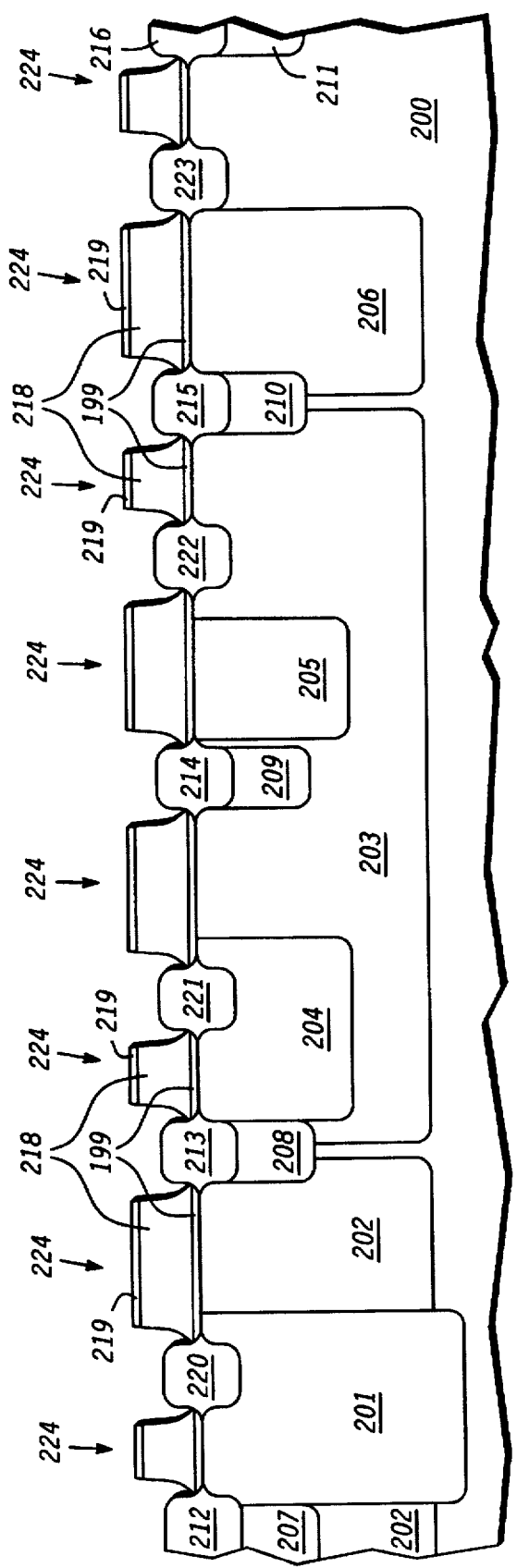

Step 105 of FIG. 1 forms the device isolation features which include field implant regions 207, 208, 209, 210, and 211 and field oxide regions 212, 213, 214, 215, 216, 220, 221, 222, and 223 of FIG. 4. If field oxide regions 212, 213, 214, 215, and 216 provide sufficient device isolation, field implant regions 207, 208, 209, 210, and 211 are not required. One of the many variations of forming field implant regions and field oxide regions or, more generally, isolation structures 207–211, 212–216, and 221–223 is as follows. A nitride layer 218, preferably approximately 1,000 Å to 2,000 Å thick, is disposed over active oxide layer 199 using a CVD process. A photoresist layer is patterned over nitride layer 218 and exposed portions of nitride layer 218 are removed using an RIE process to expose portions of the underlying active oxide layer 199, and the photoresist layer is removed. A new photoresist pattern is developed to expose certain sections of the underlying active oxide layer 199, and a field implant or channel stop implant is performed though active oxide layer 199 and into field implant regions 207, 208, 209, 210, and 211 of substrate 200. The field implant preferably uses a P-type dopant such as boron at a dose of approximately $1\times10^{13}$ atoms/cm$^{-2}$ to $5\times10^{13}$ atoms/cm$^{-2}$ and at an energy of approximately 25 KeV to 35 KeV in P-well 202. The field implant can also use an N-type dopant such as arsenic, phosphorous, or the like for field implant regions 208, 209, 210, and 211 in N-well 203.

After the field implant process, the second portion of step 105 continues by removing the new photoresist pattern used for the field implant process and initiating a local oxidation of silicon (LOCOS) process to preferably grow about 3,000 Å to 9,000 Å of silicon dioxide at a temperature of roughly 800° C. to 1,200° C. for about 2 hours to 4 hours. The LOCOS process grows field oxide regions 212, 213, 214, 215, 216, 220, 221, 222, and 223 and can also form a very thin oxide layer 219 of less than approximately 100 Å over nitride layer 218 as illustrated in FIG. 4.

Many variations of the LOCOS process, such as poly-buffered LOCOS (PBL), fully recessed LOCOS, or the like, exist and can be used in accordance with the present invention. The LOCOS process of step 105 also serves as the activation step and the diffusion step for the ions implanted into regions 204, 205, and 206 of substrate 200 during the modular implant process of step 104. The LOCOS process is performed at a lower temperature and/or at a shorter time compared to the well drive of step 102 which will keep regions 204, 205, 206 more shallow than N-well 203.

Figure 5:
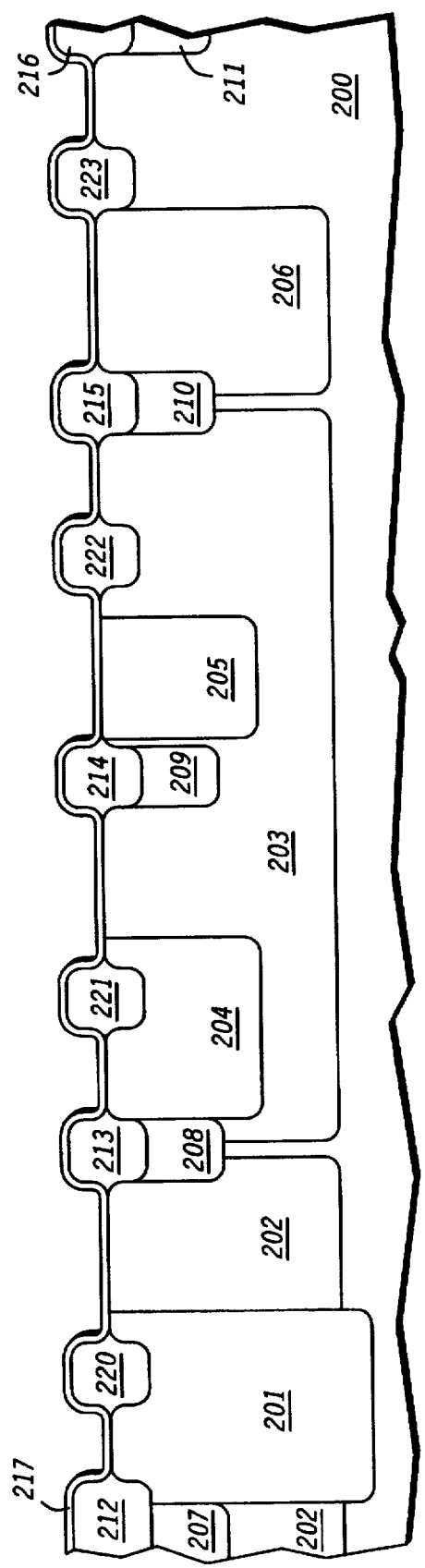

Stacks 224 comprise active oxide layer 199 under nitride layer 218 which is under very thin oxide layer 219 and, therefore, form an Oxide-Nitride-Oxide layer, commonly known as ONO. After step 105 of FIG. 1, step 106 of FIG. 1 is performed where stacks or ONO 224 of FIG. 4 are removed using a wet etch, and then step 107 of FIG. 1 is depicted in FIG. 5 where a sacrificial oxide layer 217 is thermally grown, preferably to a thickness of approximately 100 Å to 1,500 Å, by a thermal process similar to those previously described. The thickness of sacrificial oxide layer 217 will be much thinner over field oxide regions 212, 213, 214, 215, 216, 220, 221, 222, and 223 compared to over other portions of substrate 200.

Figure 6:
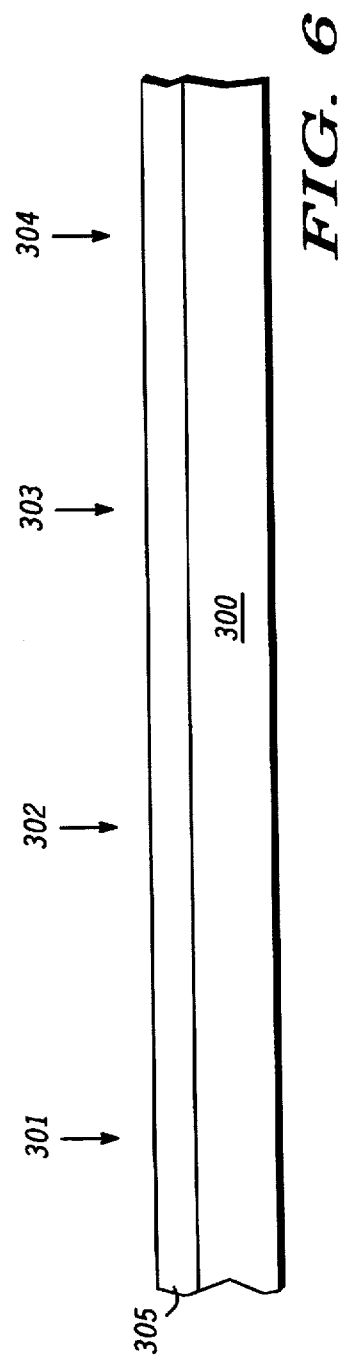
Figure 7:
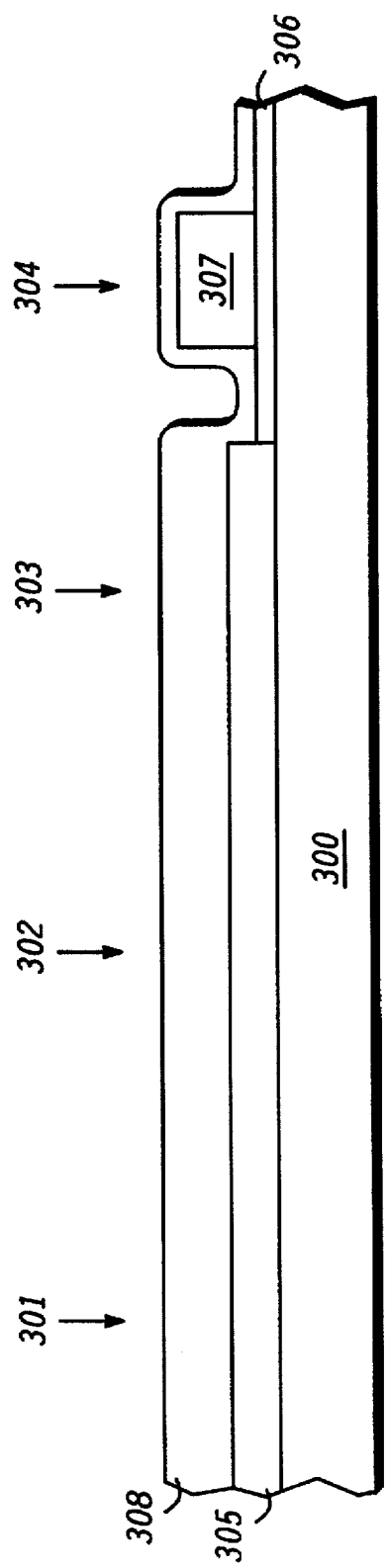

Continuing with step 108 of FIG. 1, gate oxide for the non-volatile memory (NVM) transistors is grown. Step 108 is illustrated in FIGS. 6 and 7. The cross-sectional views of FIGS. 6 through 10 depart from that of FIG. 5 in order to facilitate the description of steps 108 through 115 which explain the formation process of at least two or three gate oxides 309, 311, and 312 having three different thicknesses and which also explain the formation of at least three gate electrodes 313, 314, and 315. It will be understood that substrate 300 of FIG. 6 is similar to substrate 200 of FIG. 5 and that sacrificial oxide layer 305 of FIG. 6 is similar to sacrificial oxide layer 217 of FIG. 5. Other details of substrate 200 are left out of substrate 300 for simplification purposes. Four different gate structures will be formed in substrate 300: logic or low voltage gate structure 301, ultra high voltage gate structure 302, high voltage gate structure 303, and non-volatile memory (NVM) gate structure 304. It is important to note that the gate structure formation process described below is scaleable to provide the capability of producing devices having micron and submicron gate lengths.

The completion of steps 108 through 110 is represented in FIG. 7. A photoresist pattern is preferably used to permit the etching away of a portion of sacrificial oxide layer 305 in FIG. 6 to expose a portion of substrate 300 on which NVM gate structure 304 will be constructed in step 108 and in FIG. 7. An alternative embodiment removes all of sacrificial oxide layer 305 without a photoresist pattern, but this alternative embodiment may have some drawbacks described below. A tunnel oxide 306 is thermally grown over substrate 300 to a thickness of preferably less than approximately 100 Å. Continuing with step 109 of FIG. 1, polysilicon is deposited over substrate 300, preferably doped to below 350 ohms/square, and then etched to form a floating gate 307 of NVM gate structure 304. Subsequently, a layer of ONO 308 is formed over substrate 300 and covering floating gate 307 as depicted in FIG. 7 and as outlined in step 110 of FIG. 1. Alternatively, ONO 308 can be replaced with a different dielectric layer consisting only of silicon dioxide, for example.

Figure 8:
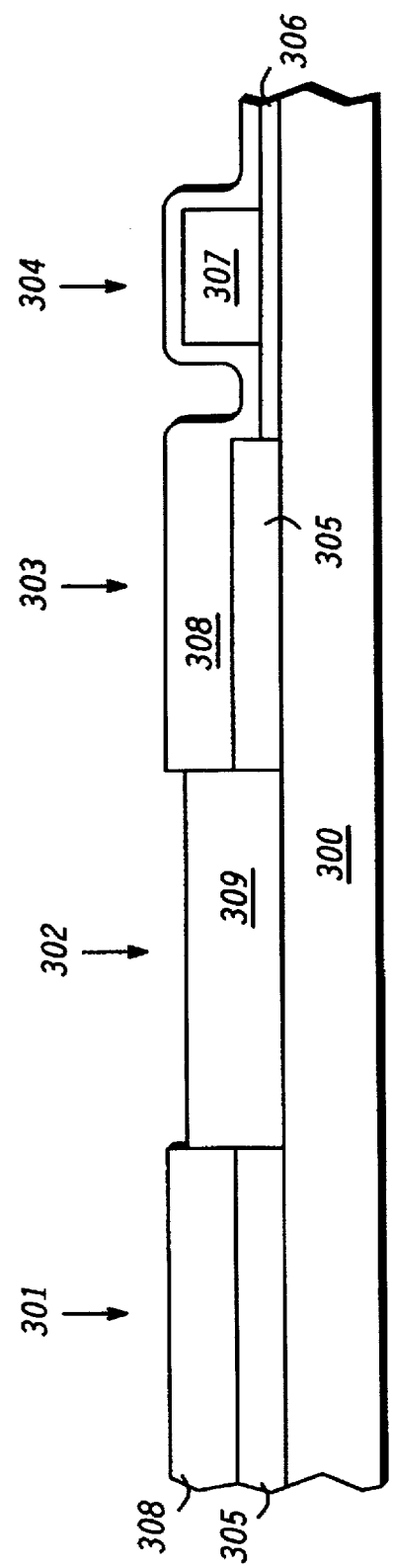

Referring now to FIG. 8 and step 111 of FIG. 1, a photoresist pattern is disposed over a portion of ONO 308 which is etched to expose a portion of substrate 300 on which ultra high voltage gate oxide 309 is thermally grown, preferably to a thickness greater than approximately 400 Å. If sacrificial oxide layer 305 has previously been etched away and is not underneath ONO 308, removal of ONO 308 may result in damage to substrate 300. Step 111 is modular for similar reasons as for step 104. If ultra high voltage transistors were not needed and step 111 were eliminated from process flow 100, the remaining steps of process flow 100 would not need to be altered. Step 111 only etches through regions of ONO 308 to expose portions of substrate 300 which require ultra high voltage gate oxide 309 and, therefore, also maintains modularity of process 100.

Figure 9:
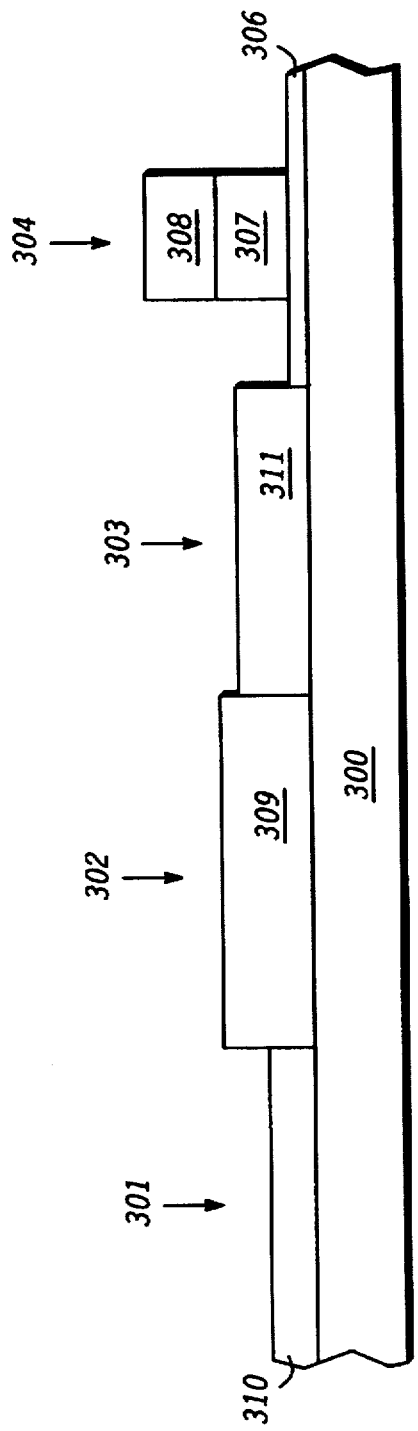

Turning to FIG. 9 and step 112 of FIG. 1, high voltage gate oxide 310 and 311 is thermally grown over substrate 300 to a thickness preferably between approximately 200 Å and 500 Å after wet etching away portions ONO 308 and sacrificial oxide layer 305. If sacrificial oxide layer 305 has previously been etched away and is not underneath ONO 308, removal of ONO 308 may result in damage to substrate 300. Since ultra high voltage gate oxide 309 is exposed during the gate oxide growth process of step 112, additional gate oxide will grow over ultra high voltage gate oxide 309 thereby increasing its thickness by over approximately 100 Å such that the total thickness of ultra high voltage gate oxide 309 is greater than roughly 200 Å. Ultra high voltage gate oxide 309 will not increase by the same 200 Å to 500 Å thickness of high voltage gate oxide 310 as explained by the widely known and commonly accepted linear parabolic model of thermal oxidation of silicon developed by Deal and Grove in "General Relationship for the Thermal Oxidation of Silicon," *Journal of Applied Physics*, volume 36, page 3770 (1965). Continuing step 112 in FIGS. 9 and 10, high voltage gate oxide 310 is removed so that low voltage gate oxide 312 can be thermally grown over substrate 300 to a preferably thickness of less than approximately 200 Å. Since ultra high voltage gate oxide 309 and high voltage gate oxide 311 are exposed during this gate oxide growth step, the Deal and Grove linear parabolic model of thermal oxidation of silicon also applies here as well.

An alternative embodiment of step 112 removes ONO 308 and sacrificial oxide layer 305 over a portion of substrate 300 of FIG. 8 designated for low voltage gate structure 301 only after formation of high voltage gate oxide 311. In this alternate embodiment, high voltage gate oxide 310 of FIG. 9 is not formed since, during the growth of high voltage gate oxide 311, ONO 308 and sacrificial oxide layer 305 remain over the portion of substrate 300 on which low voltage gate structure 301 will be constructed.

Following step 112 of FIG. 1, step 113 disposes a thin layer of polysilicon over substrate 300. The thin layer of polysilicon forms a first portion of control gate 316 and a first portion of at least three gate electrodes 313, 314, and 315 in FIG. 10. The thin layer of polysilicon also protects the underlying gate oxides from the subsequent photoresist steps associated with the threshold voltage adjustment implant process of step 114. For practical applications, the thin layer of polysilicon is preferably less than approximately 750 Å due to ion implantation limitations. If required, at least one threshold voltage adjustment implant is used to introduce additional dopant ions into channel regions located beneath low voltage gate oxide 312, ultra high voltage gate oxide 309, or high voltage gate oxide 311. The additional dopant is used to fine tune the threshold voltages of the transistors in substrate 300. In an alternative embodiment, the threshold voltage adjust implant is performed prior to the growth of the gate oxides in step 108 through step 112 and uses sacrificial oxide layer 217 as an implant screen.

After step 114, step 115 deposits a thicker layer of about 2,500 Å to 3,000 Å of polysilicon over the thin layer of polysilicon, uses a diffusion process to dope the two polysilicon layers to a resistance preferably below approximately 100 ohms/square, and etches the two polysilicon layers to form control gate 316 and gate electrodes 313, 314, and 315 which completes NVM gate structure 304, low voltage gate structure 301, ultra high voltage gate structure 302, and high voltage gate structure 303, respectively.

Figure 10:
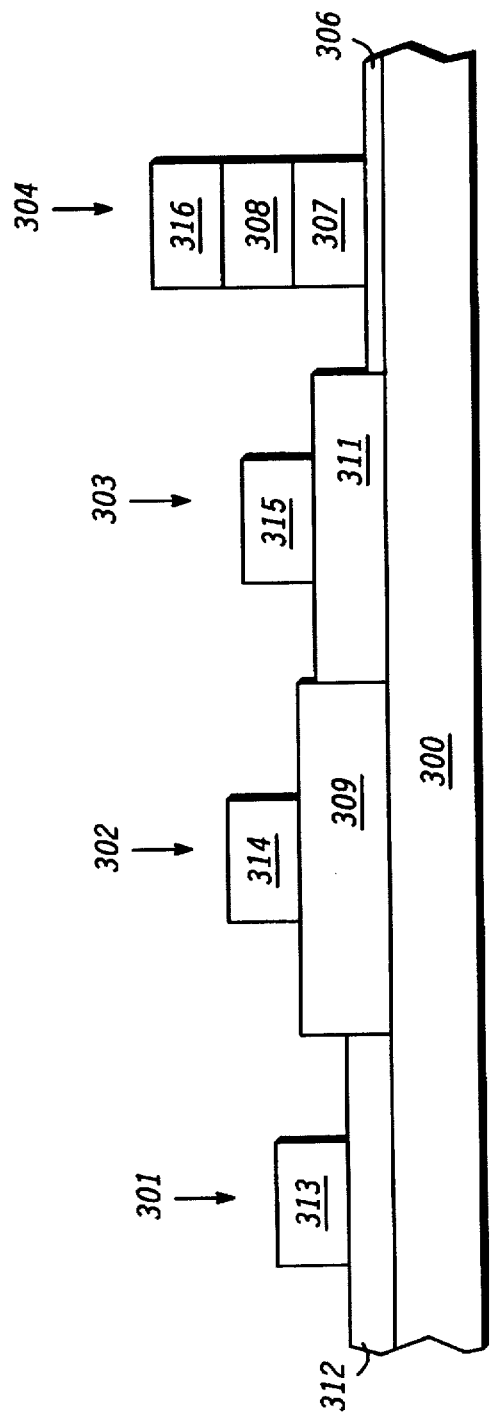

Process flow 100 continues with step 116 which is a high temperature process for repairing the high quality gate and tunnel oxides of FIG. 10 and for providing an implant screen for subsequent ion implantation steps. The implant process of step 114 and the gate etch process of step 115 will most likely damage the gate and tunnel oxides. Consequently, substrate 300 is subjected to another thermal oxide growth process to repair the damaged gate and tunnel oxide layers. Typically, a very thin layer of less than 500 Å of oxide is also formed over control gate 316 and gate electrodes 313, 314, and 315 during step 116.

Continuing with optional step 117, a conventional lightly doped source and drain implant process is used to further refine the electrical characteristics of the transistors of substrate 300 if necessary. Spacers are then formed around the gate structures of FIG. 10, and the source and drain regions and contacts are formed as indicated in step 118. Source and drain region formation can include, if necessary, multiple implants for providing different doping levels and different junction depths of N-type and P-type source, drain, emitter, collector, and base regions. Finally, an interconnect structure is fabricated over substrate 300 to electrically couple the transistors in substrate 300 of FIG. 10.

Figure 11:
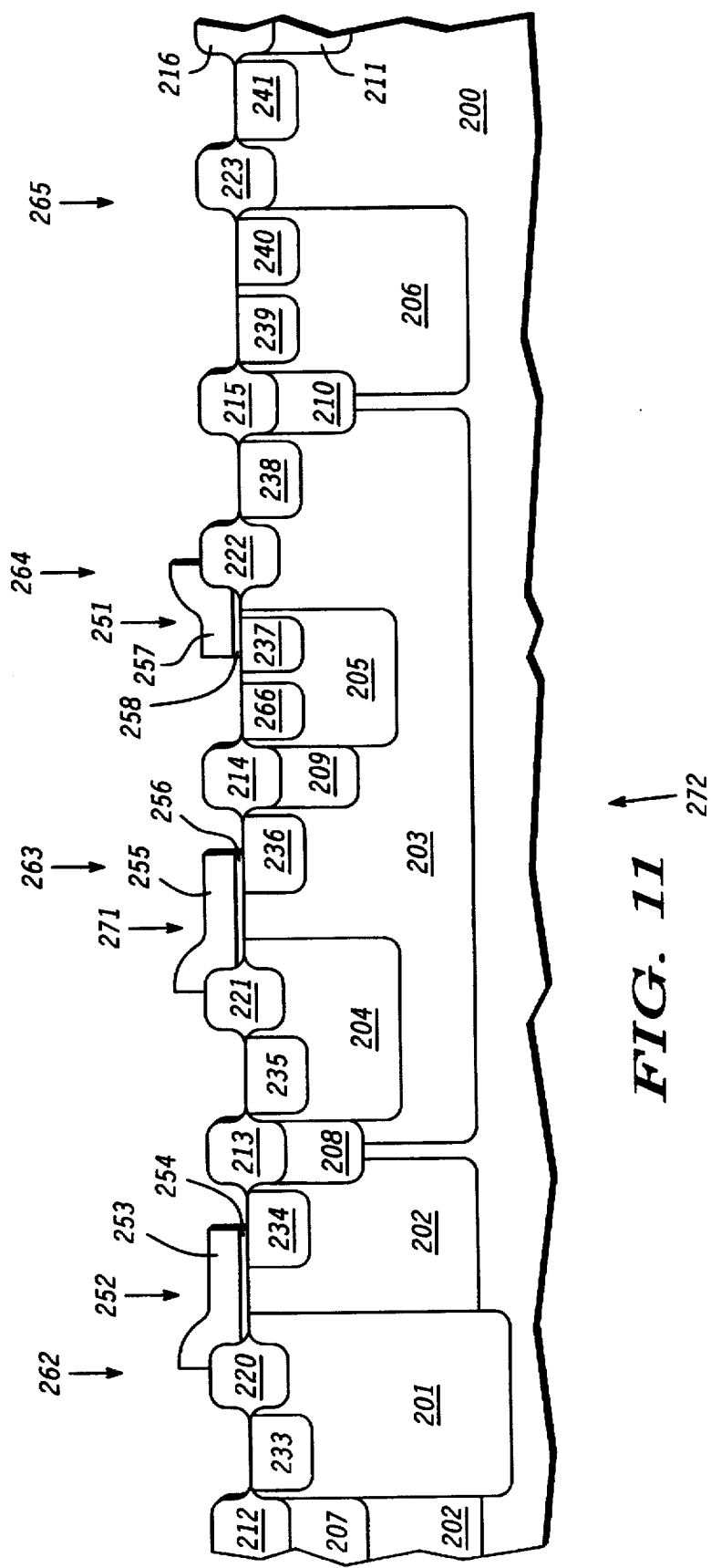
Figure 12:
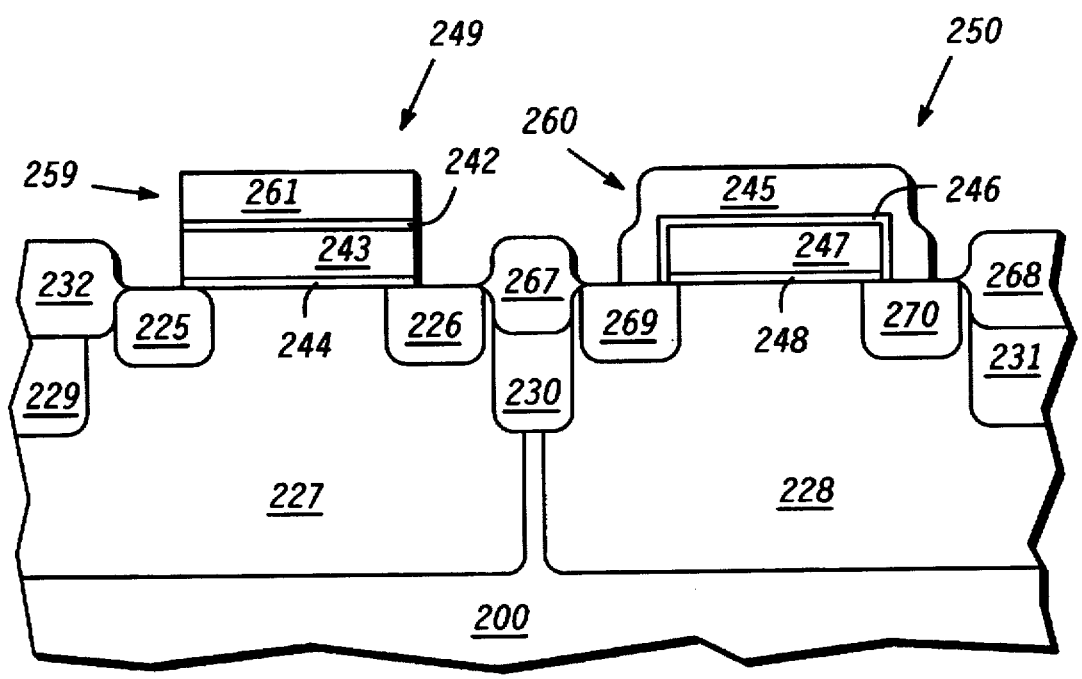

Turning now to FIGS. 11 and 12, FIGS. 11 and 12 illustrate an integrated circuit 272 having similar gate structures of FIG. 10 formed over substrate 200 of FIG. 5. For simplification purposes, FIGS. 11 and 12 depict semiconductor devices 249, 250, 262, 263, 264, and 265 without lightly doped source and drain regions, without spacers around the gate structures, without the source and drain contacts coupled to the source and drain regions, and without the interconnect structure coupling the transistors of substrate 200.

FIG. 11 depicts an ultra high voltage transistor 262 having an N-channel. Gate structure 252 of FIG. 11 is similar to ultra high voltage (UHV) gate structure 302 of FIG. 10 such that gate electrode 253 and gate oxide 254 of FIG. 11 are similar to gate electrode 314 and UHV gate oxide 309, respectively, of FIG. 10. UHV transistor 262 has a saturated drain-to-source breakdown voltage (BVdss) of greater than about 25 volts. This high BVdss is accomplished by three structures: UHV gate oxide 254, drain region 233 within N-well 201 which is within P-well 202, and field oxide region 220 underneath a portion of gate structure 252 and between drain region 233 and source region 234 (both of which are N-type).

Similar to UHV transistor 262, UHV transistor 263 of FIG. 11 has a gate structure 271 which is similar to UHV gate structure 302 of FIG. 10 wherein gate electrode 255 and gate oxide 256 of FIG. 11 are similar to gate electrode 314 and UHV gate oxide 309, respectively, of FIG. 10. However, UHV transistor 263 is different from UHV transistor 262 in that the latter is an N-channel device while the former is a P-channel device. UHV transistor 263 also has a saturated breakdown voltage (BVsds) measured from source to drain which is greater than approximately 25 volts. This high BVsds is accomplished by three structures: UHV gate oxide 256, drain region 235 within P-type region 204 which is within N-well 203, and field oxide region 221 underneath a portion of gate structure 271 and between drain region 235 and source region 236 (both of which are P-type).

UHV transistor 264 of FIG. 11 represents a laterally diffused metal-oxide-semiconductor (LDMOS) transistor having an N-channel, N-type source and drain regions 237 and 238, respectively, and P-type source region 266. Gate structure 251 of UHV transistor 264 is also similar to UHV gate structure 302 of FIG. 10 where gate electrode 257 and gate oxide 258 of FIG. 11 correspond to gate electrode 314 and UHV gate oxide 309 of FIG. 10. P-type region 205 within N-well 203, field oxide region 222 under a portion of gate structure 251, and ultra high gate oxide 258 enable UHV transistor 264 to have a BVdss greater than about 25 volts. Alternatively, gate structure 251 of FIG. 11 can represent high voltage gate structure 303 of FIG. 10 for lower voltage applications requiring a lower gate to substrate breakdown voltage.

It is noted that an alternative embodiment of UHV transistor 264 does not have field oxide region 222, and gate structure 251 is separate from drain region 238 such that gate structure 251 does not overlie drain region 238. A similar modification can be made to UHV transistors 262 and 263.

Finally, FIG. 11 depicts bipolar transistor 265 which is an UHV vertical NPN transistor and can also be a high current device with P-type base contact 240, N-type emitter 239, and N-type collector contact 241, all three of which are formed during the source and drain formation of step 118 of FIG. 1. Region 206 of FIG. 11 forms a base extension region to increase the collector to emitter breakdown voltage to beyond approximately 25 volts. To reduce beta variation, bipolar transistor 265 is preferably formed within a region where high voltage gate oxide 311 of FIG. 10 is grown and protected during step 112. This is in contrast to placing bipolar transistor 265 within a region wherein UHV gate oxide 309 of FIG. 10 is grown.

In FIG. 11, field oxide region 215 and field implant region 210 isolate bipolar transistor 265 from UHV transistor 264. Similarly, UHV transistors 264 and 263 are isolated from each other by field oxide region 214 and field implant region 209 while UHV transistors 263 and 262 are isolated from one another by field oxide region 213 and field implant region 208 and P-well 202 and N-well 203.

FIG. 12 illustrates a different portion of substrate 200 which has memory cells 249 and 250 isolated by field oxide regions 232, 267, and 268 and optional field implant regions 229, 230, and 231. In particular, memory cell 249 represents a single cell of an electrically programmable read-only-memory (EPROM) having an N-channel and memory cell 250 represents a single cell of an electrically erasable and programmable read-only-memory (EEPROM or EEPROM) having an N-channel. Regions 227 and 228 represent P-well tubs with different or similar doping levels. Source and drain regions 225 and 226, respectively, are normal or shallow N-type junctions formed during step 118 while source and drain regions 269 and 270 can be deeper N-type junctions. These deeper N-type junctions can be formed by implanting N-type dopants after the floating gate formation of step 109 and before the ONO formation of step 110 of FIG. 1. The N-type dopants will diffuse deeper into substrate 200 because they are subjected to extra thermal cycles during the gate oxide formation processes of steps 111 and 112.

Gate structures 259 and 260 of FIG. 12 are both similar to NVM gate structure 304 of FIG. 10 wherein tunnel oxides 244 and 248 of FIG. 12 represent tunnel oxide 306 of FIG. 10, floating gates 243 and 247 of FIG. 12 represent floating gate 307 of FIG. 10, ONO 242 and 246 of FIG. 12 represent ONO 308 of FIG. 10, and control gates 261 and 245 of FIG. 12 represent control gate 316 of FIG. 10.

If gate structure 259 of FIG. 12 were changed to represent low voltage gate structure 301 of FIG. 10, then memory cell 249 could be converted into a low voltage transistor 249 used in an MCU. Similarly, if gate structure 259 of FIG. 12 were changed to represent high voltage gate structure 303, then memory cell 249 could be transformed into a high voltage transistor 249.

The process flow 100 of FIG. 1 introduces only 3 additional photolithography masks to an MCU process flow: two masks during the modular implant process of step 104 and one mask during the modular gate oxide formation during step 111. Therefore, minimal process complexity is introduced into process flow 100 for fabricating UHV and high current devices on the same chip as an MCU.

While specific embodiments have been described above, it is understood that many process step variations exist. For instance, while the field effect transistors depicted in FIG. 11 are asymmetrical, one skilled in the art will comprehend that symmetrical transistors can also be constructed with process flow 100. Moreover, fabrication of other semiconductor devices such as resistors, capacitors, or the like are included within the scope of the present invention. Additionally, although bipolar transistor 265 is an NPN transistor, the artesian will recognize that a complimentary PNP bipolar device can also be fabricated by using similar methods as described above.

Furthermore, while bipolar transistor 265 is a vertical bipolar transistor, it is realized that a lateral bipolar transistor can also be constructed using process flow 100. Bipolar transistor 265 can be converted from a vertical NPN device to a vertical PNP device by adding a P-extension or collector region within N-well 203 between field oxide regions 215 and 216 during the modular implant process of step 104. Formed during the source and drain formation of step 118, base contact 240 would be N-type while emitter 239 and collector contact 241 would be P-type. Accordingly, base extension region 206 would be N-type.

Additionally, bipolar transistor 265 can be fabricated with deeper junction depths for emitter 239 or for collector contact 241. The deeper junction depths provide enhanced beta or transistor gain and also provide higher breakdown voltage for bipolar transistor 265. The junction depths for emitter 239 and collector contact 241 can be made deeper by using an additional longer and/or higher temperature anneal. However, the junction depths are preferably made deeper by implanting emitter 239 and collector contact 241 during the optional $E^2$PROM source and drain implant, mentioned previously, which occurs between the floating gate formation of step 109 and the ONO formation of step 110. The implanted dopants will diffuse deeper into substrate 200 because they are subjected to extra thermal cycles during the gate oxide formation processes of steps 111 and 112.

Therefore, in accordance with the present invention, it is apparent there has been provided an improved method of fabricating an integrated circuit having logic, memory, high current, analog, and high voltage capabilities which overcomes the disadvantages of the prior art. The present invention successfully combines modular process steps with an MCU process flow without adversely affecting the MCU devices, while adding only minimal process complexity, and while remaining cost effective.

We claim:

1. A method of fabricating an integrated circuit having semiconductor devices, the method comprising the steps of:
   providing a substrate;
   forming a first region having a first conductivity type in the substrate by implanting ions of the first conductivity type and activating ions of the first conductivity type prior to forming a second region;
   forming the second region having a second conductivity type in a portion of the first region to increase breakdown voltage for at least one of the semiconductor devices;
   fabricating a floating gate over a portion of the first region of the substrate;
   fabricating at least two gate oxides overlying portions of the first region, the at least two gate oxides having at least two different thicknesses;
   forming a first portion of at least two gate electrodes overlying the at least two gate oxides;
   forming a control gate over the floating gate to build a portion of a memory cell and forming a second portion of the at least two gate electrodes overlying the first portion of the at least two gate electrodes;
   fabricating source and drain regions in the first region and the second region of the substrate; and
   electrically coupling the source and drain regions, the at least two gate electrodes, and the control gate.

2. The method according to claim 1, further comprising:
   forming the second region by implanting ions of the second conductivity type into a portion of the first region; and
   forming field oxide regions over portions of the first region, wherein forming the field oxide regions activates the ions of the second conductivity type.

3. The method according to claim 1, further comprising implanting a threshold voltage adjustment implant through the first portion of at least one of the at least two gate electrodes and into the first region.

4. The method according to claim 1, further including increasing a breakdown voltage of at least one of the semiconductor devices by forming the second region in a portion of the first region, by disposing field oxide regions over a portion of the first region, by disposing at least one of the at least two gate oxides over a portion of the second region wherein the at least one of the at least two gate oxides has a thickness greater than 200 Å, and by disposing at least one of the at least two gate electrodes overlying the at least one of the at least two gate oxides.

5. The method according to claim 1, further providing a bipolar transistor and a field effect transistor for the semiconductor devices and wherein forming the second region further includes forming a portion of a base extension region for the bipolar transistor.

6. A method of fabricating an integrated circuit, the method comprising the steps of:
   providing a substrate;
   doping a first region in the substrate with ions having a first conductivity type;
   heating the substrate to diffuse the ions having the first conductivity type into the substrate to form the first region;
   doping a second region within the first region with ions having a second conductivity type to form the second region;
   forming isolation structures over a portion of the first region of the substrate;
   forming a floating gate over a portion of the first region of the substrate;
   forming a first gate oxide having a thickness between approximately 200 Å and 500 Å, and a second gate oxide having a thickness less than approximately 200 Å overlying a portion of the first region;
   disposing a first portion of a control gate over the floating gate and disposing a first portion of gate electrodes overlying the first gate oxide an a the second gate oxide;
   implanting at least one threshold voltage adjustment implant into a portion of the first region of the substrate;
   disposing a second portion of the gate electrodes over the first portion of the gate electrodes and disposing a second portion of the control gate over the first portion of the control gate, the control gate and floating gate forming a portion of a memory cell;
   doping source and drain regions in the first region and the second region of the substrate; and
   fabricating an interconnect structure electrically coupling the source and drain regions, the gate electrodes, and the memory cell.

7. The method according to claim 6, further comprising disposing a portion of the first gate oxide over a portion of one of the isolation structures and over a portion of the second region.

8. The method according to claim 6, further comprising implanting the at least one of the gate electrodes overlying a portion of the first region and over a portion of the second region.

9. The method according to claim 6, further comprising implanting the at least one threshold voltage adjustment implant into the first region of the substrate under the first gate oxide.

10. The method according to claim 6, further comprising:

activating the ions of the first conductivity type while heating the substrate; and activating the ions of the second conductivity type while forming the isolation structures.

11. The method according to claim 6, further comprising disposing the first gate oxide and the second gate oxide over a portion of the second region of the substrate and between the isolation structures.

12. A method of fabricating an integrated circuit, the method comprising the steps of:

providing a substrate;

fabricating a memory cell in the substrate;

fabricating a first transistor in the substrate, the first transistor having a breakdown voltage greater than approximately 25 volts;

fabricating a second transistor in the substrate, the second transistor having a breakdown voltage between approximately 15 volts and 25 volts;

fabricating a third transistor in the substrate, the third transistor having a breakdown voltage less than approximately 15 volts; and fabricating an interconnect structure located over the substrate and electrically coupling the memory cell, the first transistor, the second transistor, and the third transistor.

13. The method according to claim 12, further including fabricating field effect transistors for the memory cell, the first transistor, the second transistor, and the third transistor.

14. The method according to claim 12, further including fabricating bipolar transistors for the first transistor, the second transistor, and the third transistor.

* * * * *